United States Patent [19]

Subda, Jr.

[11] Patent Number: 5,739,692

[45] Date of Patent: Apr. 14, 1998

[54] DEVICE FOR MONITORING VOLTAGE AND AMPERAGE ON AN ARTICLE BEING PASSED THROUGH AN ELECTROCOATING BATH

[75] Inventor: Joseph John Subda, Jr., Macomb, Mich.

[73] Assignee: E. I. du Pont de Nemours and Company, Wilmington, Del.

[21] Appl. No.: 554,645

[22] Filed: Nov. 8, 1995

[51] Int. Cl.[6] .................................................. G01N 27/02
[52] U.S. Cl. .......................... 324/444; 324/439; 324/724; 204/434; 204/406; 205/181; 205/474
[58] Field of Search .............................. 324/425, 439, 324/444, 450, 722, 724; 204/434, 406; 205/791, 81, 82, 83, 84, 474

[56] References Cited

U.S. PATENT DOCUMENTS

| | | | |
|---|---|---|---|
| 3,658,675 | 4/1972 | De Vittorio et al. | 204/181 |
| 4,956,610 | 9/1990 | Galm et al. | 324/425 |
| 5,287,060 | 2/1994 | Reddy et al. | 324/439 |
| 5,324,399 | 6/1994 | Ludwig et al. | 204/434 X |

OTHER PUBLICATIONS

Mark Podany, "In-Tank Measurements of Voltage, Current Density, and Temperature", *Electrocoat '92*, 11-1 to 11-12, Mar. 1992.

*Primary Examiner*—Ernest F. Karlsen
*Assistant Examiner*—Diep Do

[57] ABSTRACT

A device for monitoring voltage and amperage on an article being electrocoated with a primer composition in an aqueous electrocoating bath which contains the following components: a sealed container for holding electrical components; a recording device positioned in the container for recording voltage and amperage; a voltage measuring circuit board positioned in the container and electrically connected to the recording device containing an electrical circuit for measuring; a first electrical probe positioned on the article being electrocoated and electrically connected to the circuit of the circuit board for measuring voltage and a second electrical probe for measuring amperage positioned on the article being electrocoated and electrically connected to the recording device; whereby as the article being electrocoated with a primer composition is passed through an aqueous electrocoating bath, measurements of voltage and amperage are being taken at set time intervals as the article is passing through electrocoating bath to monitor the voltage and amperage of the bath.

9 Claims, 5 Drawing Sheets

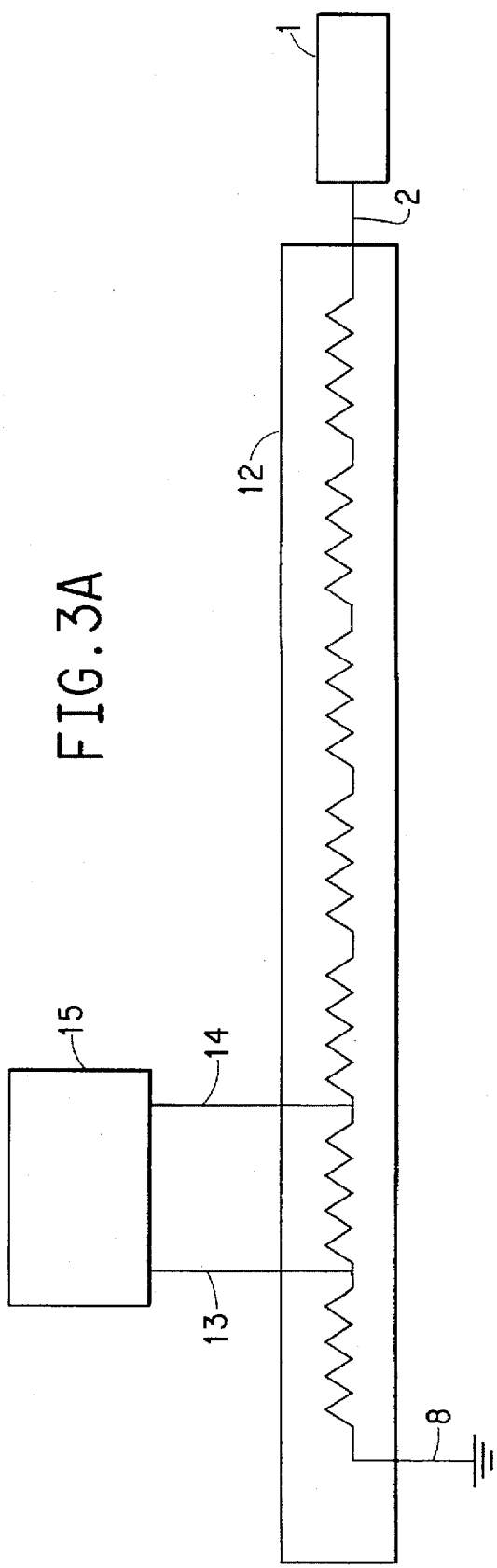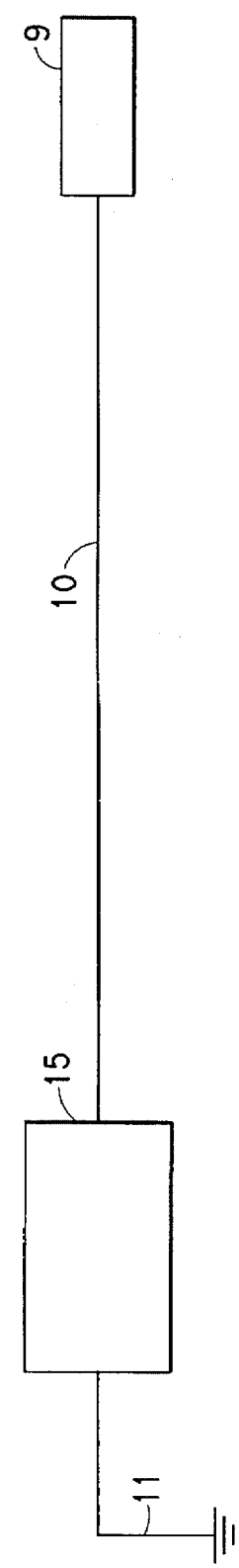

DEVICE FOR MONITORING VOLTAGE AND AMPERAGE ON AN ARTICLE BEING PASSED THROUGH AN ELECTROCOATING BATH

BACKGROUND OF THE INVENTION

This invention is directed to a monitoring device for an electrocoating bath and in particular to a device which monitors the voltage and amperage on an article being electrocoated.

Electrocoating of paints on various substrates is a well known process that has been used for many years. Electrocoating of primers on electrically conductive articles such as steel auto and truck bodies or small metallic parts generally for autos and trucks by immersion of the article in an electrocoating bath and applying an electrical current to coat the article is a conventional method for applying such primers. Electrocoating provides complete coverage of the primer even in recessed areas of the article particularly in auto or truck bodies and thereby provides for significantly improved corrosion resistance. Monitoring of these electrocoating baths has been a problem. In a typical electrocoating bath, monitoring devices only measure total output of voltages and amperage but these measurements do not show voltages and amperages at various points in the electrocoating bath. For example, an electrocoating tank has a number of electrodes along its side. The article being coated is the opposite electrode. It is very difficult to detect if one of the electrodes of the tank is defective or incorrectly positioned. Minor changes of film thickness of the coating that is being electrocoated may occur which is an indication that there may be a problem but there has been no practical method for finding the problem. There is a need for a relatively easy to use, simple and economical instrument that can be used to monitor specific areas of an electrocoating tank to determine where the problems, if any, are in the tank or in the equipment used in the tank.

De Vittorio et al U.S. Pat. No. 3,658,676 issued Apr. 25, 1972 shows a monitoring system for an electrocoating bath which monitors pH, temperature, resistance, and the like and allows for adjustment of the bath to keep the bath within proper operating parameters. Galm et al U.S. Pat. No. 4,956,610 issued Sep. 11, 1990 measures current density in an electrocoating bath by using self sustaining magnetic oscillation. There is nothing in any of the patents which provides for the monitoring of voltage and amperage in specific areas of the electrocoating bath which can be used for example to detect malfunctioning equipment or incorrectly positioned equipment.

SUMMARY OF THE INVENTION

A device for monitoring voltage and amperage on an article being electrocoated with a primer composition in an aqueous electrocoating bath which contains the following components:

(1) a sealed container for holding electrical components;
(2) a recording device positioned in the container for recording voltage and amperage;
(3) a voltage measuring circuit board containing an electrical circuit for measuring voltage positioned in the container and electrically connected to the recording device;
(4) a first electrical probe positioned on the article being electrocoated and electrically connected to the circuit of the circuit board for measuring voltage and a second electrical probe for measuring amperage positioned on the object being electrocoated and electrically connected to the recorder;

whereby as the article being electrocoated with a primer composition is passed through an aqueous electrocoating bath, measurements of voltage and amperage are being taken at set time intervals as the article is being passed through the bath to monitor voltage and amperage in the bath.

BRIEF DESCRIPTION OF THE DRAWINGS

FIGS. 3a and 3b show circuit diagrams for the measurement of voltage and amperage.

DETAILED DESCRIPTION

The device of this invention is used to monitor voltage and amperage at given time intervals in an electrocoating bath as the article being electrocoated passes through the bath. The voltage and amperage data are used to determine if there is a problem at any point in the electrocoating process as the article is being electrocoated. By using this device, a faulty anode can be detected or it can be determined if an anode is in operation or if a rectifier is operating at its set voltage. The device also can be used to determine the proper placement of anodes in an electrocoating bath. The data collected by the device can be used to determine film build of the coating that has been electrodeposited, to develop more efficient electrocoat facilities, to select optimum designs of anodes used in electrocoating tanks and as a research tool to more fully understand the electrocoating process. Film build can be determined by integration of the area under the voltage curve that has been determined by the device.

Figure 1:
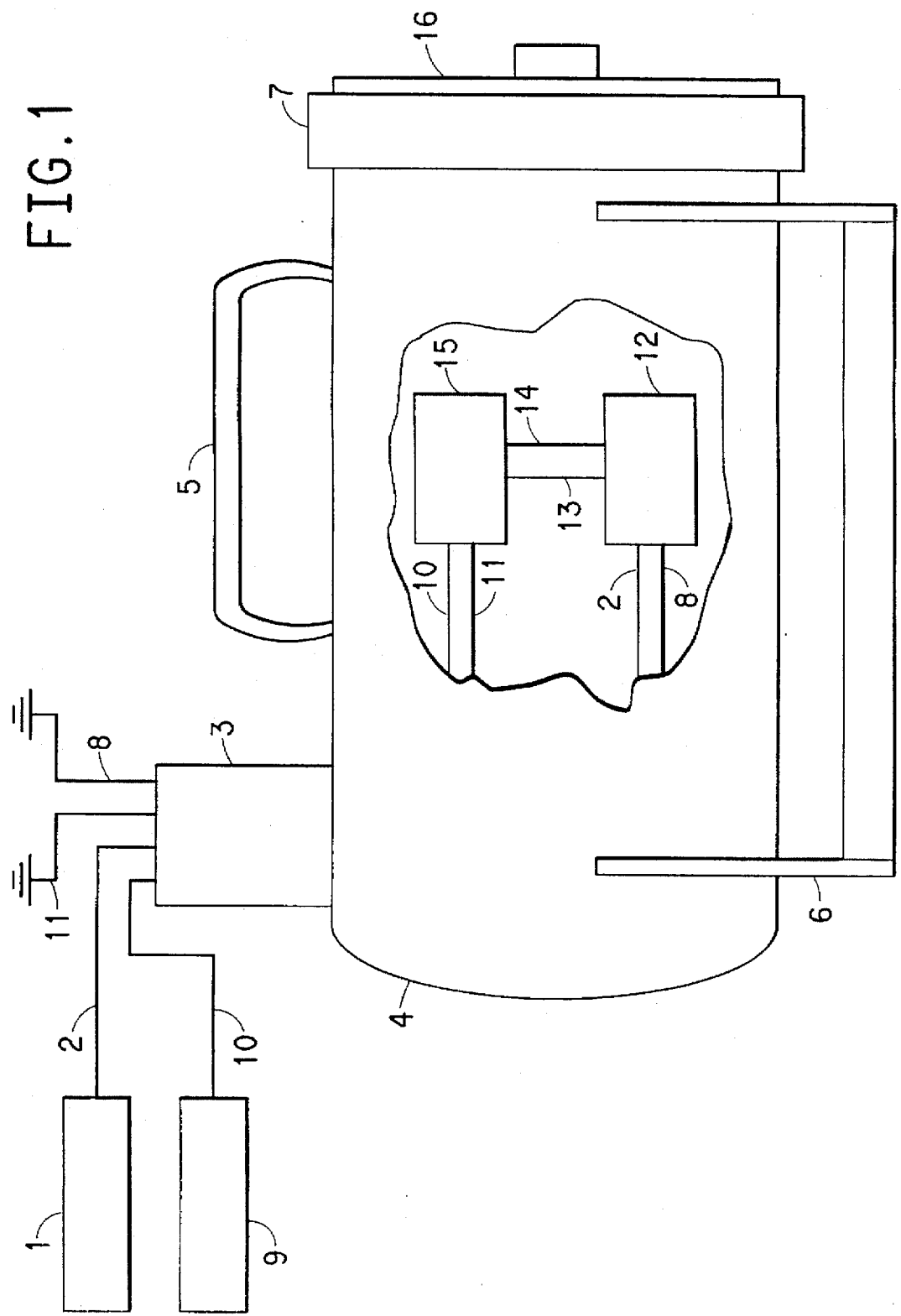
FIG. 1 shows a block diagram of the device for measuring voltage and amperage of an electrocoating bath.

FIG. 1 shows a block diagram of the device in which a housing 4 having a threaded flange 7 into which a threaded cap 16 is screwed into place to form a water proof container having a base 6 to hold the container in its upright position and has a handle 5 for carrying. The housing and flange are made of a non-electrically conductive material. For example, in the device as shown in FIG. 1, the housing 4 and the flange 7 is PVC (polyvinyl chloride) and the cap 16 is PVC. Any other water proof design and water proof material can be used to house the electrical components of the device, for example the material can be a resin reinforced with fiber glass (hereinafter referred to as fiberglass). Instead of a cap as shown, a fiberglass cover with a gasket can be bolted into place on a container of a rectangular box formed of fiberglass In the cut out of FIG. 1, a recorder 15, typically a "Rustrak" Ranger I or II is shown as being positioned inside of the housing 4 and connected via wire 10 to the amperage probe 9 which is attached to an article being electrocoated and is insulated from the article. A ground wire 11 is attached to the recorder and the article being electrocoated. A special circuit is not needed to measure amperage and the signal is fed directly into the recorder. Also, the recorder is attached via wires 13 and 14 to the voltage circuit board 12 to receive the voltage signal.

The voltage circuit board 12 which is more fully described in FIG. 3a is connected via wire 2 to voltage probe 1 which is attached to and insulated from the article being electrocoated in the electrocoating bath. The circuit board 12 is grounded to the article being electrocoated via wire 8. The wires 2, 3, 8, 10 and 11 pass through a collar 3 attached to the housing. The collar has a water proof seal for the wires attached to the housing 4. Typical wires that are used in this device are insulated 18 gauge copper wire.

Figure 2:
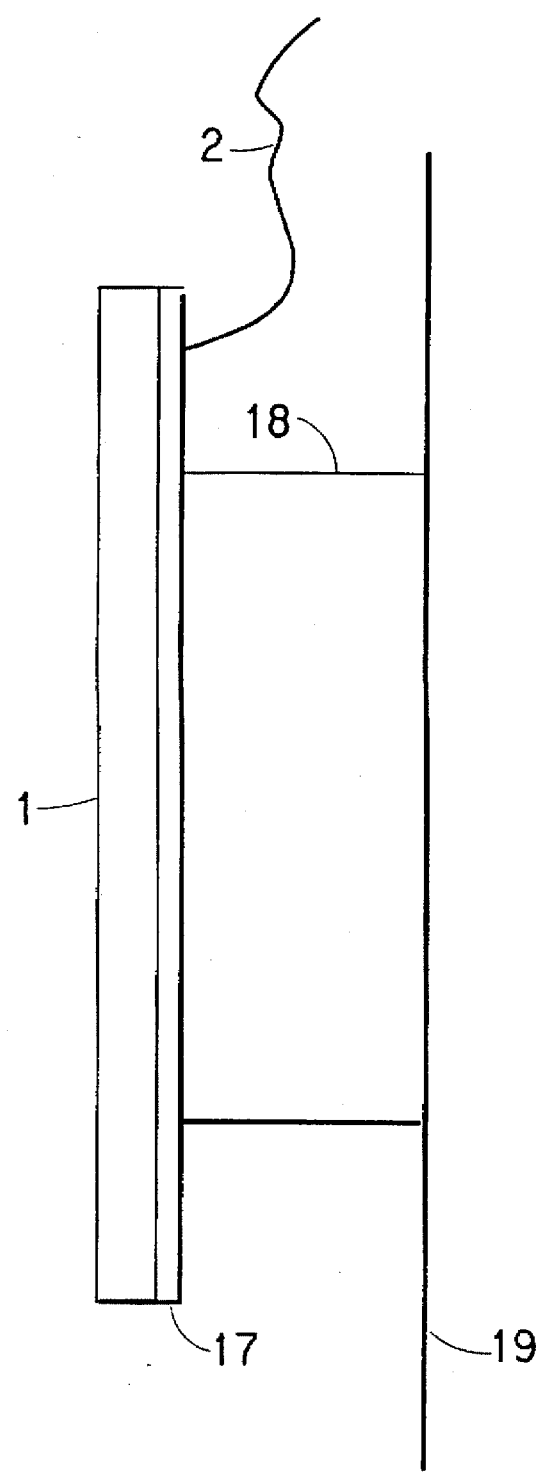
FIG. 2 shows a probe attached to a substrate such as an automobile body.

FIG. 2 shows the voltage probe 1 having wire 2 attached in an attached position to an article 19 which is to be electrocoated via a magnet 18. The probe 1 is insulated from the magnet 18 and article 19 by an insulating layer 17 which typically is a non-conductive plastic coating. The probe can be made of any conductive material but typically, is a phosphated steel. Amperage Probe 9, preferably is of the same construction but can be of another construction and still be operative.

FIG. 3a shows the circuit board 12 having a resistor circuit that is used to measure voltage. The resistor circuit needs to have a resistance that is sufficiently high to prevent coating of the probe during the electrocoating process. Typically, 40–100 kilo-ohms of total resistance are used. A ground wire 8 is connected to the article being electrocoated and to the circuit board 12. The resistor circuit of the circuit board preferably contains 14 resistors in series having a total resistance of about 53 kilo-ohms. The resistors used and the values of these resistors are as follows: ten—4.99 kilo-ohm resistors, one—1.2 kilo-ohm resistors, one—1.0 kilo-ohm resistor, one—600 ohm resistor and one—200 ohm resistor. The recorder 15 is connected across the 200 ohm resistor via wires 13 and 14 with wire 14 to the positive connection and wire 13 to the negative connection of the recorder 15. The circuit board is connected to the probe 1 via wire 2.

FIG. 3b shows a typical circuit for measuring amperage. The recorder 15 is connected via wire 11 to the article being electrocoated and to the probe 9 via wire 10.

Figure 4:
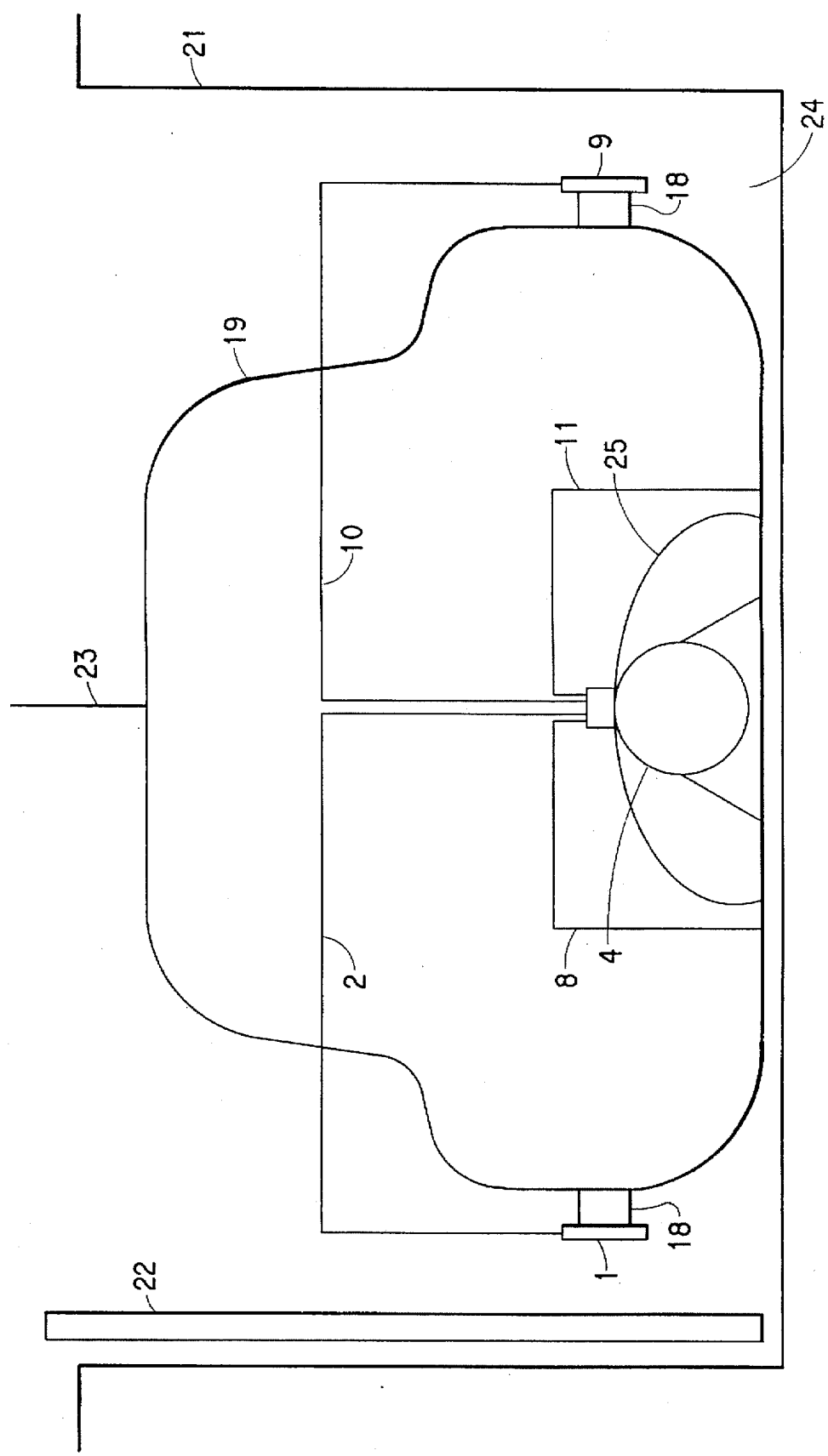
FIG. 4 shows the device in use attached to an auto body in an electrocoating tank.

FIG. 4 shows the device as used in an electrocoating tank to measure voltage and amperage. An electrocoating tank 21 having an anode 22 and filled with a cathodic electrocoating composition 24 has an auto or truck body 19 position therein and the body 19 is being held by hanger 23. Amperage probe 9 is held on the body 19 by magnet 18 and connected by wires to the device 4 and a ground wire 11 is connected to the body 19 from the device 4. Voltage probe 1 is held on the body 19 by magnet 18 and connected by wire 2 to the device 4 and a ground wire 8 is connected to the body 19 from the device 4. The device 4 is held in place in the body by cord 25. A strap also can be used.

Figure 5:
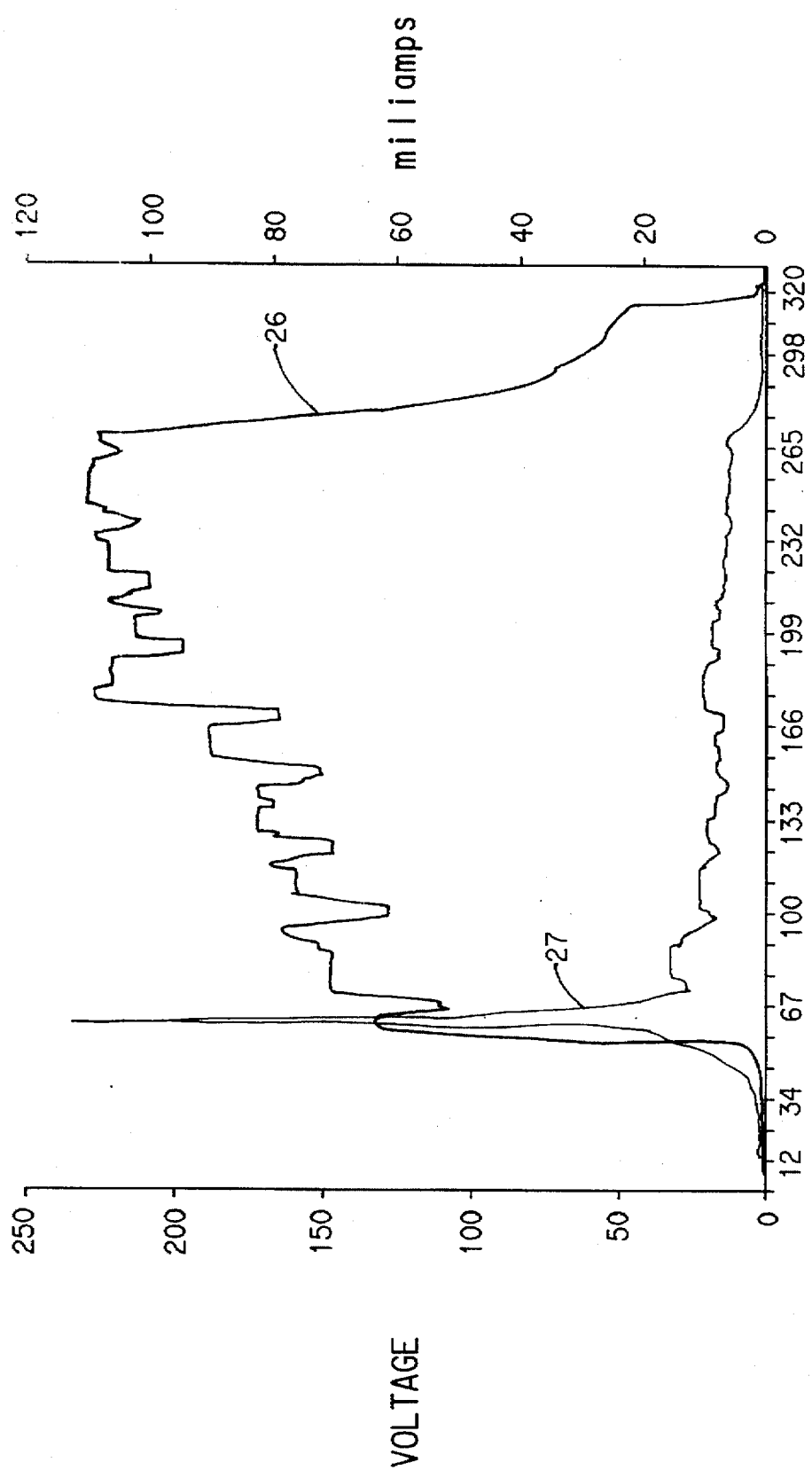
FIG. 5 shows a typical voltage curve and amperage curve for an autobody as the autobody progresses through an electrocoating bath.

FIG. 5 shows a graph having two curves. Curve 26 shows voltage and curve 27 shows amperage as measured on an auto body as it is passed throughout an electrocoating bath. Time in seconds is shown on the bottom of the graph and volts on the left axis and milliamps on the right axis of the graph.

To obtain the voltage and amperage data for FIG. 5, voltage and amperage probes are attached to an autobody as shown in FIG. 4 that is being passed through an electrocoating bath and readings are taken in one second intervals. It is important that reading be taken in a time range of about 64 microseconds to 5 seconds to obtain meaningful data. The voltage and amperage data are stored in the recorder and down loaded into a computer, typically, a "Compaq" LTE Elite 4/75 CX using a Pronto Program and a Microsoft Excel Program is used to make the graphs shown in FIG. 5. Film build can be measured by integrating the area under the voltage curve.

The device of this invention is useful not only for measuring voltage and amperage on the article being electrocoated at various intervals in the electrocoating bath but is useful to determine film build, the positioning of electrodes in an electrocoating tank, determine if electrodes are in operation, if a voltage rectifier is operational, and can be used as a research tool to more fully understand the electrocoating process.

What is claimed is:.

1. A device for monitoring voltage and amperage on an article being electrocoated with a primer composition in an aqueous electrocoating bath which comprises the following components:
    (1) a sealed container for holding electrical components;
    (2) a recording device positioned in the container for recording voltage and amperage;
    (3) a voltage measuring circuit board positioned in the container and electrically connected to the recording device containing an electrical circuit for measuring voltage;
    (4) a first electrical probe flat and free of any openings positioned outside of the sealed container and attached directly to the surface of the article being electrocoated and electrically connected to the circuit of the circuit board for measuring voltage and a second electrical probe flat and free of any openings positioned outside of the sealed container for measuring amperage and attached to the article being electrocoated and electrically connected to the recording device;

whereby the article being electrocoated with a primer composition is being passed through an aqueous electrocoating bath, measurements of voltage and amperage to which the article is being directly subjected are being taken at set time intervals as the article is being passed through the bath to monitor the voltage and amperage on the article.

2. The device of claim 1 in which the set time interval is 64 microseconds–5 seconds.

3. The device of claim 1 in which the voltage measuring circuit board contains a sufficient level of resistance to prevent electrocoating of the probe during electrocoating of the article.

4. The device of claim 3 in which the voltage measuring circuit board contains a resistor circuit of 40–100 kilo-ohms.

5. The device of claim 1 in which the sealed container is of a nonconductive water proof material and has a leak proof design.

6. The device of claim 1 in which the amperage and voltage probes are each formed of an electrical conductive material coated with an insulating material and attached to the article being electrocoated by a magnetic material.

7. A process for monitoring voltage and amperage on an article in an electrocoating bath containing an aqueous electrocoating primer composition with a device which comprises
    (1) attaching probes of the device on an article that is being electrocoated with the primer composition;
    (2) taking voltage and amperage readings at various points and at set time intervals on the article being electrocoated with the primer as the article is being passed through the bath and recording these readings; and
    (3) creating voltage and amperage curves and analyzing the voltage and amperage curves to determine problems in the bath;

wherein the device for monitoring voltage and amperage comprises the following components:

(a) a sealed container for holding electrical components;

(b) a recording device positioned in the container for recording voltage and amperage;

(c) a voltage measuring circuit board positioned in the container and electrically connected to the recording device containing an electrical circuit for measuring voltage;

(d) a first electrical probe flat and free of any opening positioned outside of the sealed container and attached directly to the surface of the article being electrocoated and electrically connected to the circuit of the circuit board for measuring voltage and a second electrical probe flat and free of any openings positioned outside of the sealed container for measuring amperage and attached to the article being electrocoated and electrically connected to the recording device.

8. The process of claim 7 in which film build of the coating being deposited on the article is determine by integrating the area under the voltage curve.

9. The process of claim 7 in which the electrocoating bath is cathodic electrocoating bath an the article being electrocoated is a steel autobody or steel part.

* * * * *